United States Patent [19]
Yumitori et al.

[11] Patent Number: 5,428,577
[45] Date of Patent: Jun. 27, 1995

[54] SEMICONDUCTOR STORAGE DEVICE HAVING WORD-LINE VOLTAGE BOOSTER CIRCUIT WITH DECODER AND CHARGER

[75] Inventors: Fuminori Yumitori; Yasuhiro Fujii, both of Kawasaki, Japan

[73] Assignee: Fujitsu Limited, Kawasaki, Japan

[21] Appl. No.: 117,773

[22] Filed: Sep. 8, 1993

[30] Foreign Application Priority Data

Oct. 23, 1992 [JP] Japan .................................. 4-286099

[51] Int. Cl.$^6$ .............................................. G11C 7/00
[52] U.S. Cl. ...................... 365/203; 365/204; 365/230.06
[58] Field of Search ............... 365/203, 204, 189.01, 365/190, 230.01, 230.03

[56] References Cited

U.S. PATENT DOCUMENTS

| | | | |
|---|---|---|---|
| 4,958,326 | 9/1990 | Sakurai | 365/230.03 |
| 5,034,919 | 6/1991 | Sasai et al. | 365/203 |
| 5,274,597 | 12/1993 | Ohbayashi et al. | 365/230.03 |

FOREIGN PATENT DOCUMENTS

63-129596  6/1988  Japan .

*Primary Examiner*—Joseph A. Popek
*Assistant Examiner*—Vu Le
*Attorney, Agent, or Firm*—Armstrong, Westerman, Hattori, McLeland & Naughton

[57] ABSTRACT

A semiconductor storage device having a word-line voltage booster circuit includes: a plurality of word-lines connected to each memory cell array; a drive signal generation circuit for producing a word-line drive signal having a voltage higher than a power supply voltage; a decoder circuit for transmitting the word-line drive signal produced by the drive signal generation circuit, when the drive signal generation circuit is selected by an address signal; and a charging circuit connected to a signal path which transmits the word-line drive signal from the drive signal generation circuit to the decoder circuit. The charging circuit charges the signal path before the word-line drive signal is output to the signal path.

4 Claims, 12 Drawing Sheets

| Fig.1A | Fig.1B |

SEMICONDUCTOR STORAGE DEVICE HAVING WORD-LINE VOLTAGE BOOSTER CIRCUIT WITH DECODER AND CHARGER

BACKGROUND OF THE INVENTION

1. Field of the Invention

The present invention relates to a semiconductor storage device, and more particularly to a device in which the voltage of word-lines is boosted up in order to store and hold information securely for use in the field of, for example, semiconductor memory devices, to thereby complete a read or write operation.

2. Description of the Related Art

In recent years, with an advancement of information processing devices such as computers, a large number of types of semiconductor storage devices, represented by semiconductor memories such as, for example, RAM (random access memory), ROM (read only momemory) and the like, have been developed.

Nevertheless, with an increase in the speed of operation of such devices in recent computers, semiconductor memories using a higher clock speed have been used particularly in CPUs (central processing units). However, no conventional semiconductor memory can equal the processing speed of the CPU.

Therefore, it is required that a semiconductor memory having a high speed comparable to the speed of the CPU be developed.

The prior art technology of boosting the voltage of the word-lines is that a plurality of word-lines is not selected simultaneously, but that a memory cell is divided into several blocks and only one word-line is selected in each block. That is to say, if one word-line voltage boost generator circuit is provided for every block unit, the loads are comparatively small and the word-line boost generator circuit can be easily driven.

Nevertheless, the word-line load has generally increased due to the high density of recent semiconductor integrated circuits. When the word-line boost generator circuit cannot be realized due to restrictions in the layout or when it is necessary for a memory to select a plurality of word-lines simultaneously, the prior art tends to hinder any further gain in speed and efficiency.

That is to say, when the word-line load increases, the delay in boosting the word-line voltage level potential ($V_{cc}+V_{th}$) makes it difficult to reach the goal of high speed operation by boosting the word-line voltage.

SUMMARY OF THE INVENTION

It is an object of the present invention to provide a semiconductor storage device having a booster circuit which is able to rapidly increase the voltage of a word-line to a desired voltage level.

In accordance with an aspect of the present invention, there is provided a semiconductor storage device having a word-line voltage booster circuit including: a plurality of word-lines connected to each memory cell array, a drive signal generation means for producing a word-line drive signal having a voltage higher than a power supply voltage, a decoder means for transmitting the word-line drive signal produced by the drive signal generation means, when the drive signal generation means is selected by an address signal, and a charging means connected to a signal path which transmits the word-line drive signal from the drive signal generation means to the decoder means, wherein the charging means charges the signal path before the word-line drive signal is output to the signal path.

In this case, it is advantageous that the charging means is selectively activated based on a reset signal which resets the decoder means and the charging means is activated after the address signal has been established.

In accordance with another aspect of the present invention, there is provided a semiconductor storage device including: a plurality of word-lines connected to each memory cell array, a drive signal generation means for generating a word-line drive signal which has a voltage higher than the power supply voltage, a pre-decoder means for receiving a first address signal and the word-line drive signal, a main decoder means for receiving an output of the pre-decoder means and a second address signal, and a charging means connected to at least one signal path between a first signal path from the drive signal generation means to the pre-decoder means or a second signal path from the pre-decoder means to the main decoder means, wherein the charging means charges either the first signal path or the second signal path before the word-line drive signal is output to the signal path.

In this case, it is advantageous that the charging means is connected to the first signal path and the second signal path.

In accordance with the present invention, since the word-line drive signal produced by the drive signal generation means in the charging means is charged up and the waveform of the word-line drive signal rises quickly, the desired boost effect is available in a short time.

Accordingly, since the word-line attains a desired level of potential in a short time, the speed of read and write operations can be increased.

PREFERRED EMBODIMENTS OF THE INVENTION

With reference to the drawings, embodiments of the present invention will be described in comparison with the prior art.

Figures 1, 1A:
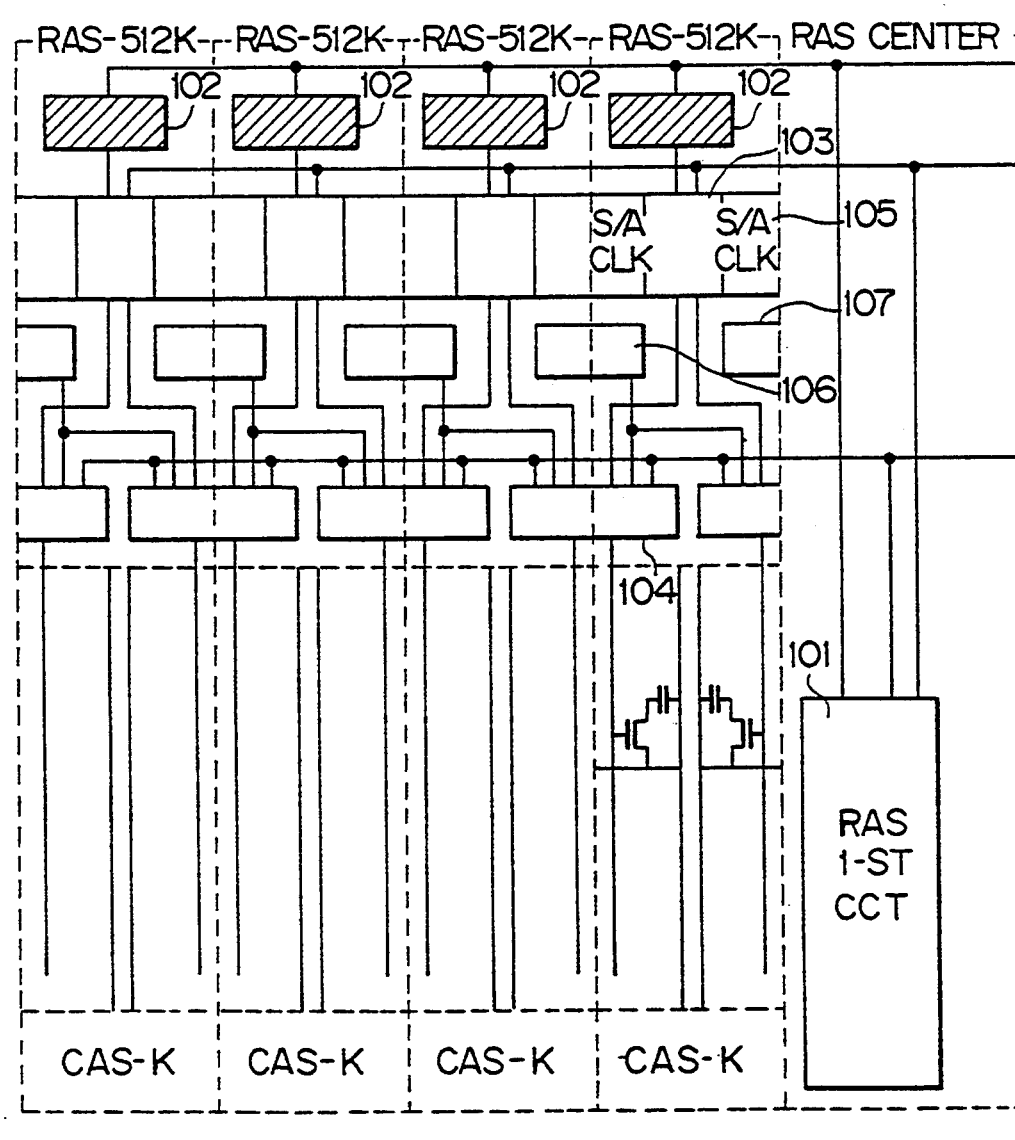
FIGS. 1A and 1B illustrate a block diagram showing an image of a prior art chip layout in a semiconductor storage device.
Figure 1B:
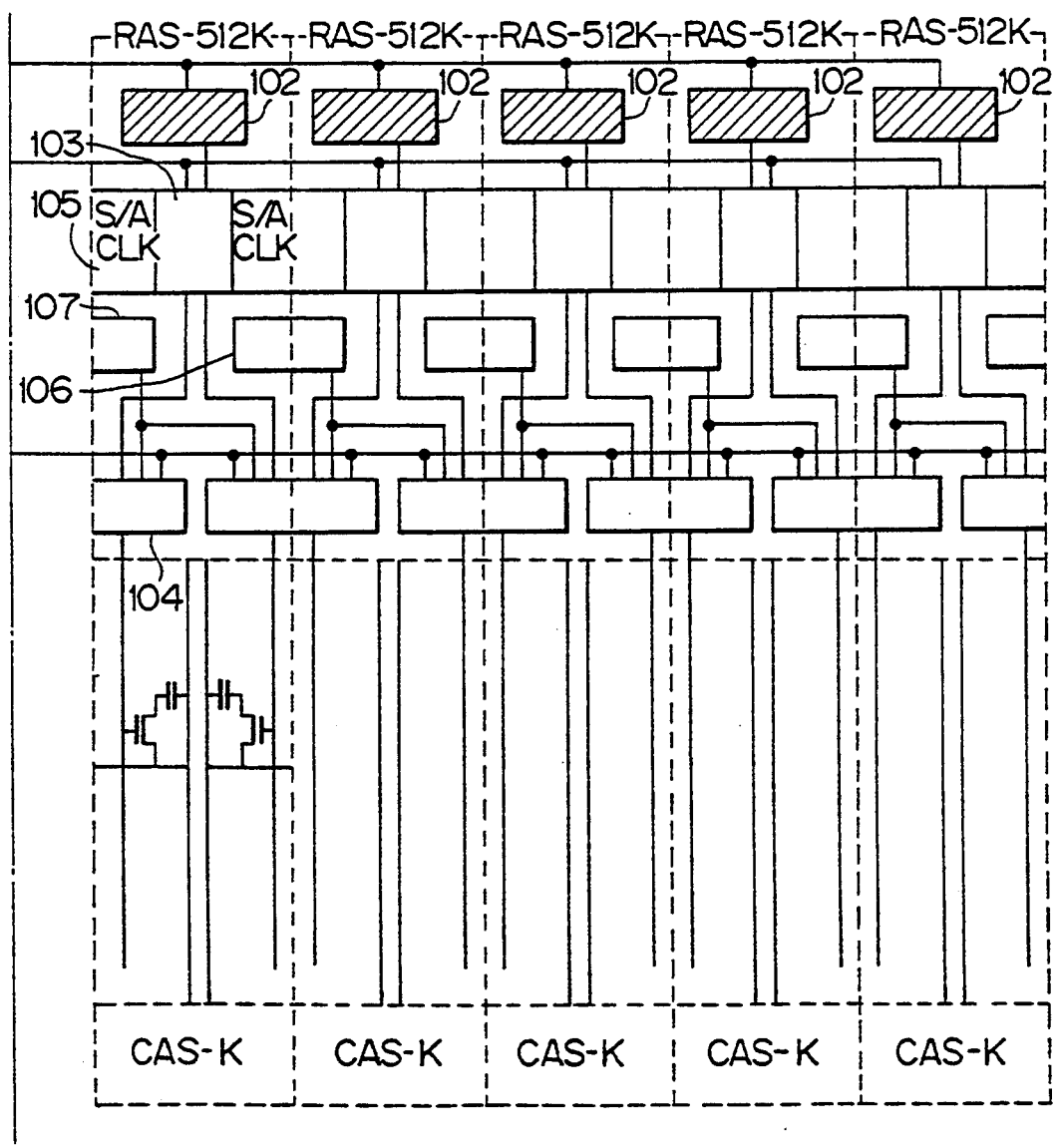
Figure 2:
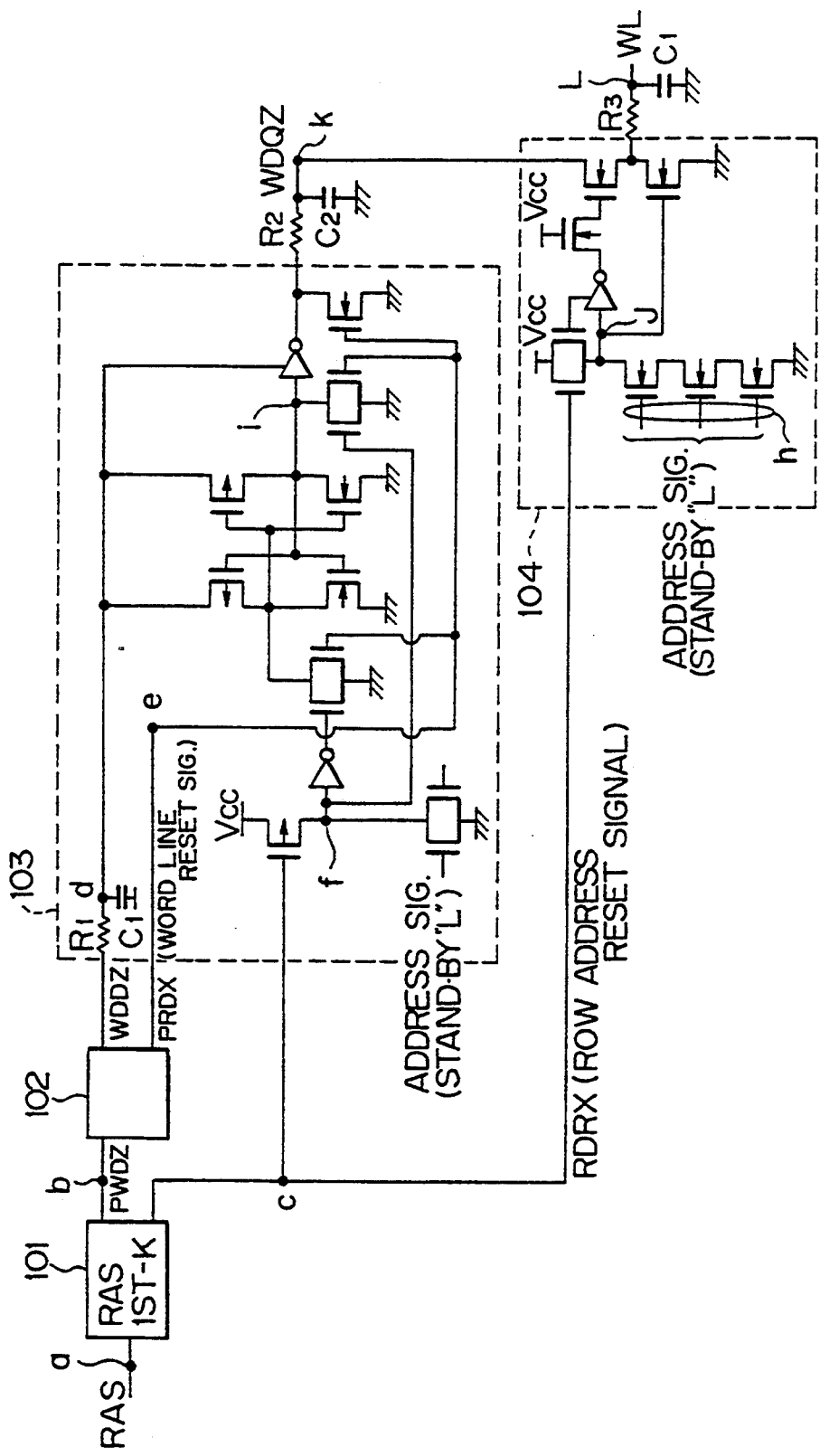
FIG. 2 is a circuit diagram showing a major configuration of a prior art device.

FIGS. 1A and 1B illustrate a block diagram showing an image of a prior art chip layout in a semiconductor storage device and FIG. 2 is a circuit diagram showing a major configuration of a prior art device.

In FIGS. 1A, 1B and 2, reference numeral 101 denotes a RAS first stage circuit, 102 a word-line voltage boost generator circuit, 103 a pre-row decoder, 104 a main row decoder, 105 an S/A clock, 106 a row driver generator circuit and 107 a word-line latch generator circuit.

As seen in FIGS. 1A, 1B and 2, the prior art word-line voltage boosting technology resides in that a plurality of word-lines is not selected simultaneously, but a memory IC is divided into several blocks and only one word-line is selected in each block.

Figure 3:
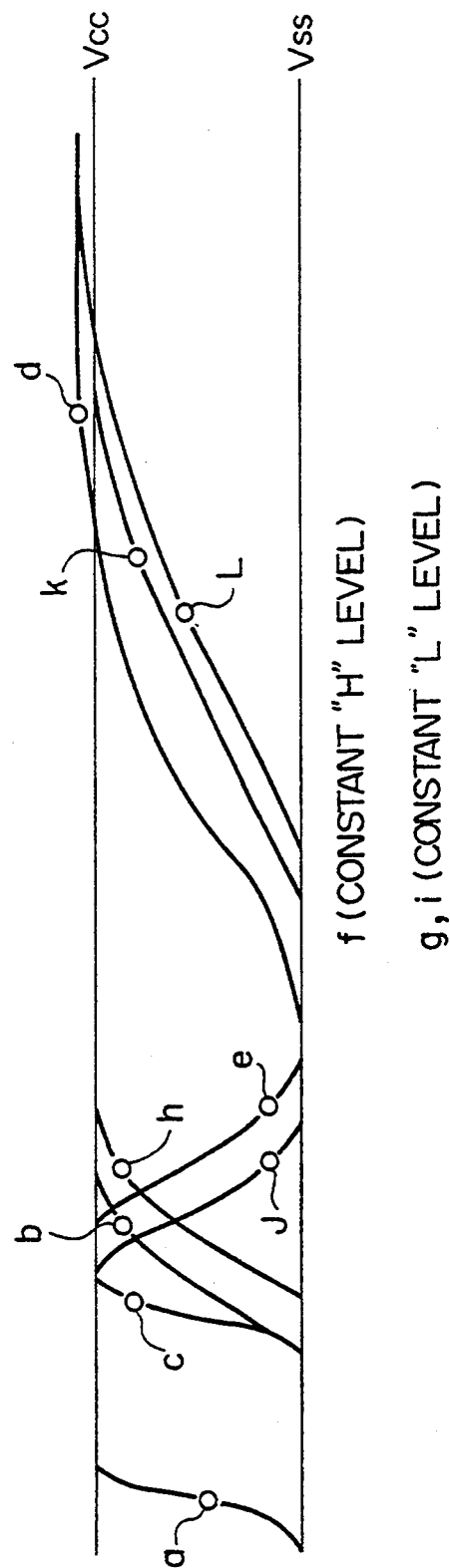
FIG. 3 is a view showing a potential level in each node in FIG. 2.

FIG. 3 is a view showing each potential level at a respective node (a, b, c, ... h, i, j, k, L) in FIG. 2. a denotes an input of RAS, b a PWDZ, c a RDRX (row address reset signal), d a WDDZ after R1, e a PRDX (a word-line reset signal), k a WDQZ, h an address signal at a stand-by "L" state, L a WL, f stands at a high level and g and i at a low level.

From FIG. 3, since a word-line boost generator circuit is provided for every block, when the loads of a word-line drive signal and a word-line drive signal after decoding are comparatively small, the word-line boost generator circuit can operate easily.

Nonetheless, the load of a word-line tends to increase on account of the high density of recent semiconductor integrated circuits. Further, when the word-line boost generator circuit does not show a conspicuous boost effect by a restriction based on the layout, or it is required for a memory to select a plurality of word-lines simultaneously, the prior art configuration cannot offer an increase in speed or high efficiency.

On the other hand, since it takes time to boost the word-line voltage, the efficiency of boosting will be deteriorated if the word-line reaches an insufficient voltage potential.

The present invention aims at a semiconductor storage device which can boost its word-line voltage up to a desired potential in a short time.

With reference to the drawings, an embodiment of the present invention will be described hereinafter.

Figure 4:
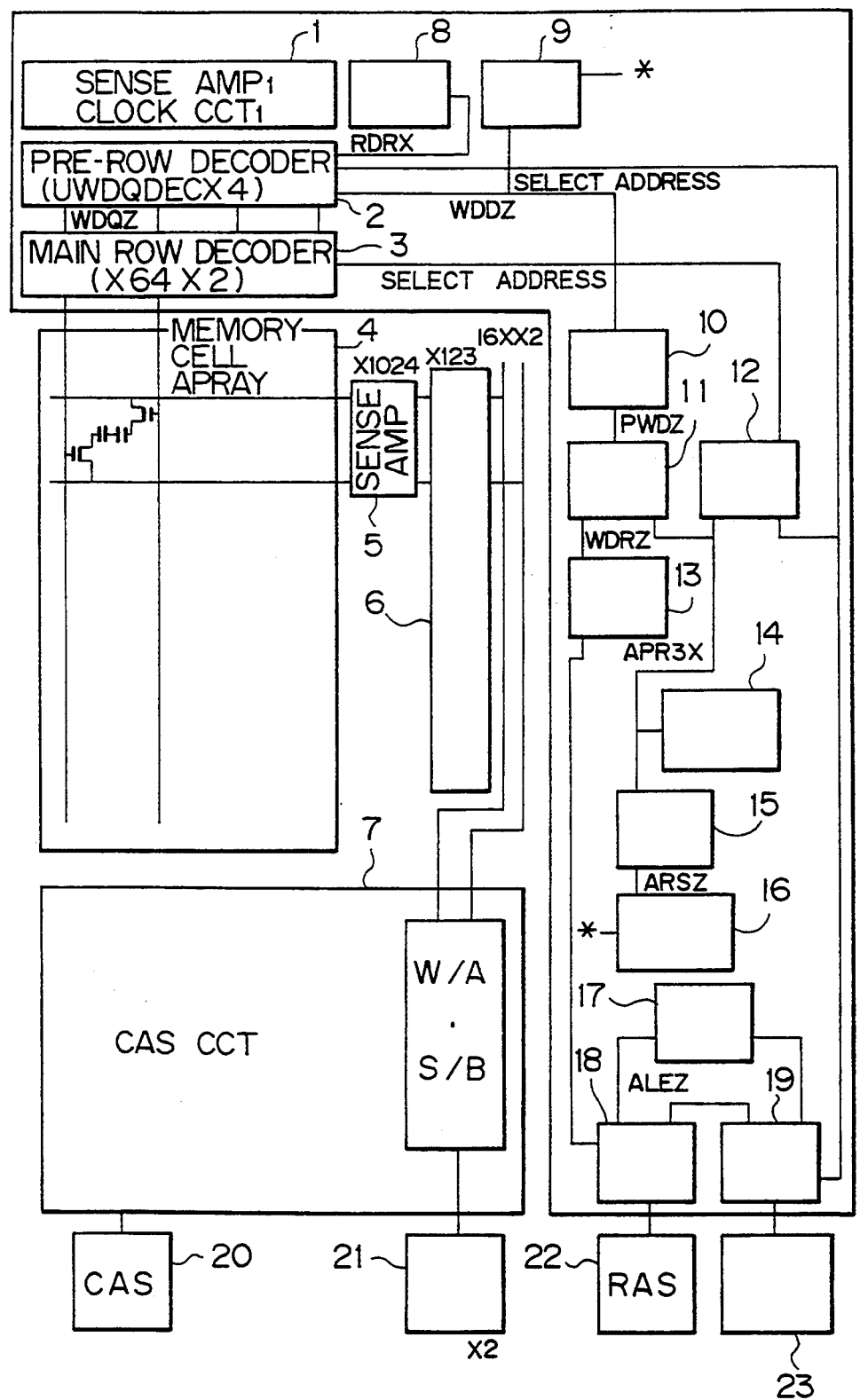
FIG. 4 is a block diagram showing a general schematic construction of a semiconductor storage device in accordance with the present invention.
Figure 5A:
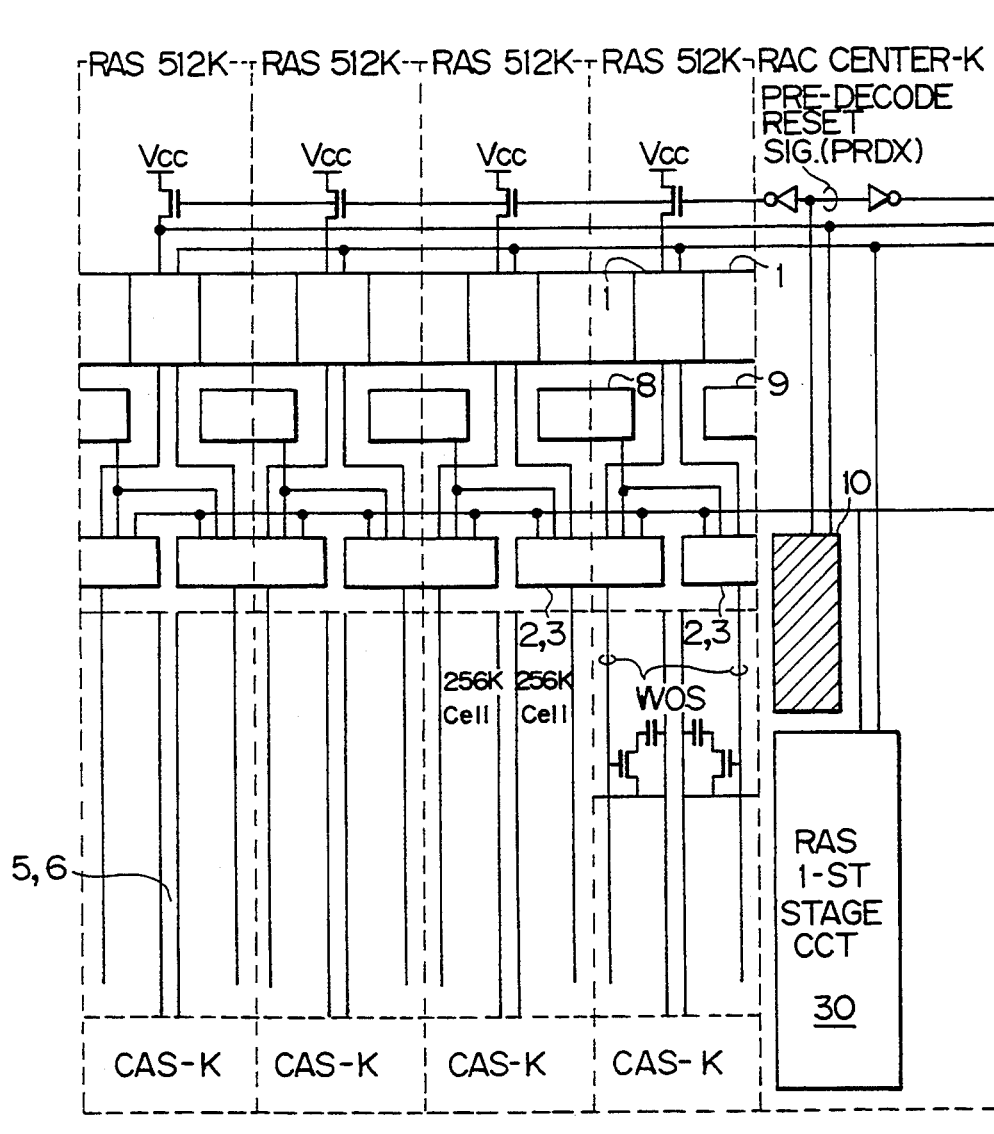
FIGS. 5A and 5B illustrate a block diagram showing the construction in a chip layout image of an embodiment in accordance with the present invention.
Figure 5B:
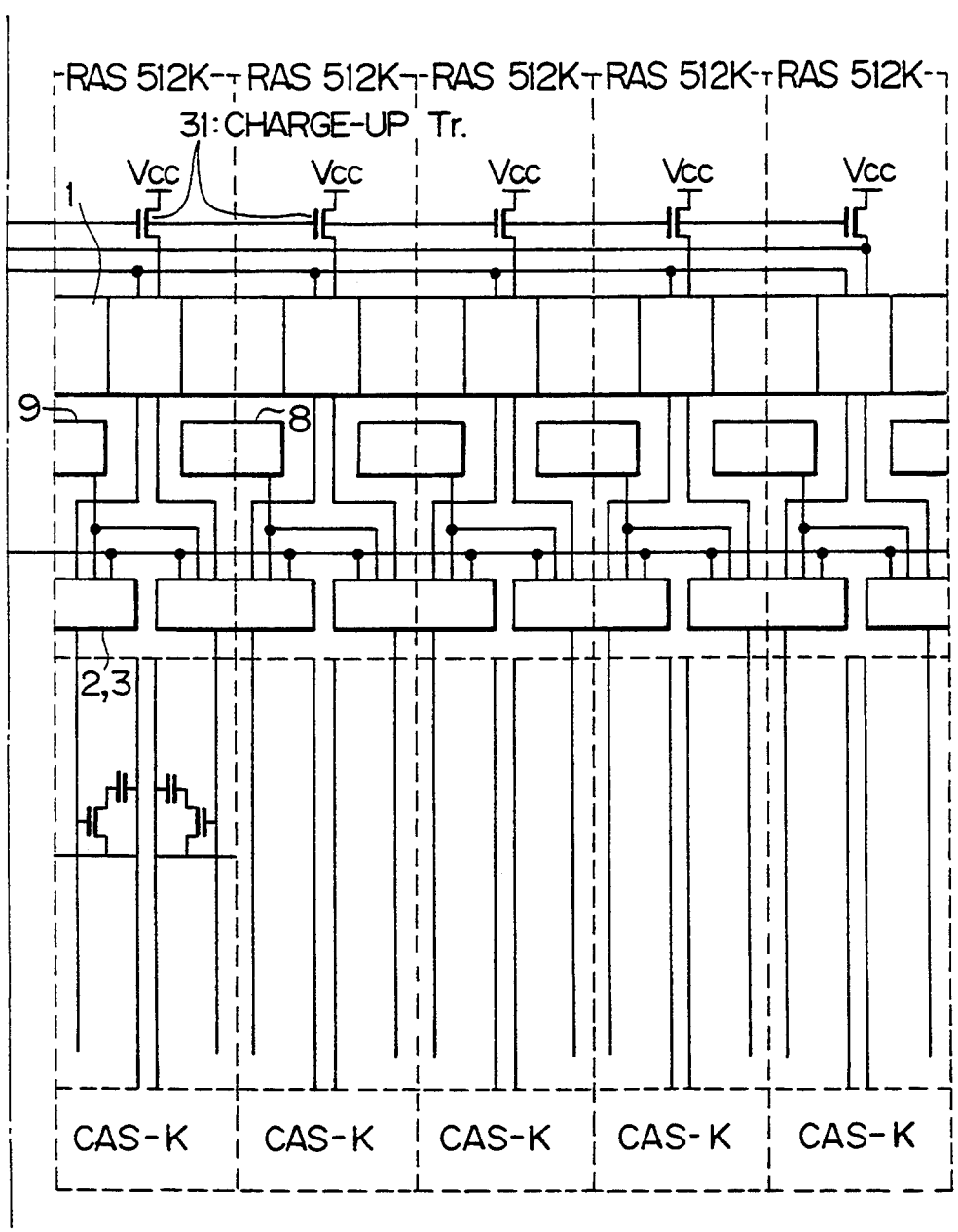
Figure 6:
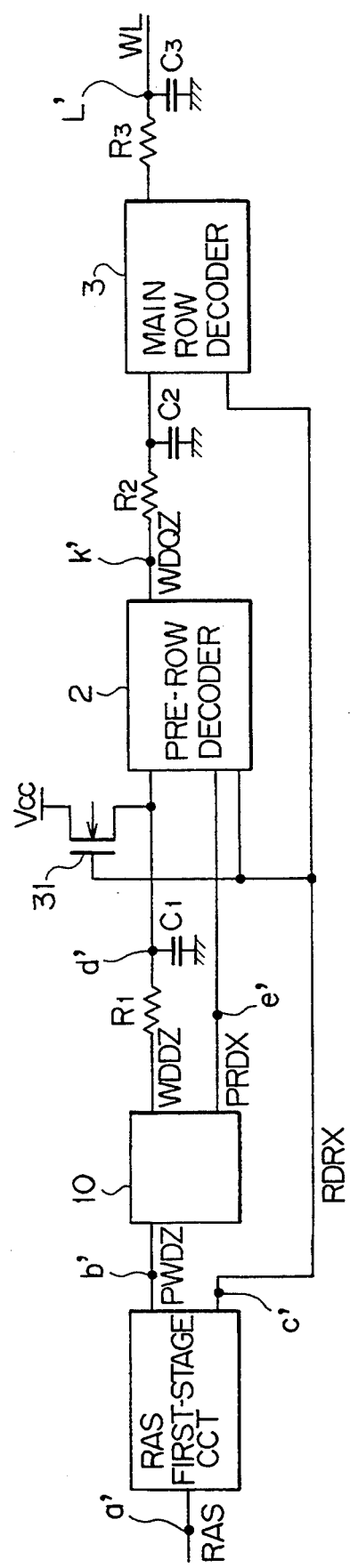
FIG. 6 is a block diagram showing the circuit construction of a major part of an embodiment.

FIG. 4–6 are views showing an embodiment of a semiconductor storage device in accordance with the present invention.

FIG. 4 is a block diagram showing a general schematic construction of the present embodiment. FIGS. 5A and 5B illustrate a block diagram showing a chip layout image of the present embodiment, and FIG. 6 is a circuit diagram showing the construction of a major part in the present embodiment.

First, the structure of an embodiment will be described. In FIG. 4, reference numeral 1 denotes a sense-amplifier clock circuit, 2 a pre-row decoder, 3 a main-row-decoder, 4 a memory-cell array, 5 a sense amplifier, 6 a column decoder, 7 a column-address strobe (CAS) circuit, 8 a row-decoder-reset circuit, 9 a word-line-latch circuit, 10 a word-line-boost circuit which is a drive-signal-generation means, 11 a pre-word driver circuit, 12 a row pre-decoder, 13 a word-driver circuit, 14 a redundant signal circuit, 15 a row-address-latch circuit, 16 an address-reset circuit, 17 a row-address circuit, 18 a row-address-strobe (RAS) first stage circuit, 19 a row-address buffer, 20 a column-address strobe (CAS) signal, 21 a data-I/O circuit, 22 a row-address-strobe (RAS) signal, and 23 an external-address signal, respectively.

When active, the row decoder reset generation circuit 8 releases a main row decoder 3 from a standby state and when reset, after a word-line voltage falls, resets the main row decoder 3 by another word-line latch signal which is output from the word-line latch circuit 9. Thereby, while the word-line voltage is being raised, since the reset of other circuits is not effected, a malfunction can be avoided.

The word-line latch circuit 9 outputs to the address reset circuit 16 a latching signal that a word-line goes from a HIGH state to a LOW state. Since it takes some time until the word-line reaches a low state, it is designed that some delay time is provided and the resetting of other circuits may not occur when the word-line goes from a "HIGH" to a "LOW" level.

The word-line boost circuit 10 is provided with both a capacitor for storing charges temporarily in order to boost the potential of the word-line, and an inverter for increasing the stored charges.

If the input signal changes from a "LOW" state to a "HIGH" state, a word-line boost signal (WDDZ) goes to a value of $(V_{cc}-V_{th})$ from a "LOW" state. In this case, since the boost circuit 10 comes to have a time that the WDDZ signal approaches to the value of $(V_{cc}-V_{th})$ from a "LOW" state by means of five stages of inverters in the word-line boost circuit 10 and an effect of raising a drive capability, the last stage of the inverters charge up a capacitor to boost the WDDZ signal above the value of $V_{cc}$ (from a value of $(V_{cc}-V_{th})$) and the word-line is boosted above the value of $V_{cc}$ by the potential level.

The pre-word-driver circuit 11 receives a word-line boost signal (WDDZ) and a signal output from the row address latch circuit 15 to output a PWDZ signal. The PWDZ signal is input to the word-line-boost-generation circuit 10.

The row-pre-decoder 12 is a pre-decoder to output an address to the main row decoder 3. The embodiment includes one hundred and twenty eight (64×2) main-row-decoders 3 in each 512K block to select one from among 128 main-row-decoders. Since four decoded boost signal lines WDQZ 0–3 are connected to a main row decoder 3, the number of word-lines in each 512K block becomes 512 (=128×4).

The word driver circuit 13 outputs a control signal WDRZ of word-line boost signal WDDZ. Since it is necessary to drive the word-line after the select operation of the main decoder has been finished, the word driver circuit 13 produces a time-delay corresponding thereto.

The row-address-latch circuit 15 outputs a signal for effecting a set/reset operation in a respective circuit (for example, the pre-word driver circuit 11, row pre-decoder 12, a redundant signal circuit 14, ¼ word driver decoder and the like) by a control of an inverted RAS signal and an address reset signal.

In an address reset time, i.e., when the address reset circuit 16 goes from an active state to a stand-by state, it is necessary to hold each circuit in a stand-by state after the word-lines change from a "HIGH" state to a "LOW" state and have been latched. Therefore, the word-line-boost signal (WDDZ) is driven via an inverted delay of the word-line-latch circuit 9 and the WDDZ signal is input to the address reset circuit 16 to output an address reset signal.

After the row address circuit 17 takes into consideration the time until an externally offered address signal is completely latched in a row address buffer 19, an address complementary signal is output. Therefore, the row address circuit 17 produces a time delay accordingly.

The RAS first-stage circuit 18 receives a rising (from a "LOW" state to a "HIGH" state) RAS signal and outputs an address latch signal to the row address buffer 19. At the same time, the RAS first-stage circuit 18 outputs a signal to the other circuits such as the word-driver circuit 13, the row-address latch circuit 15 and the row-address circuit 17.

The row-address buffer 19 inputs an address signal from an external system before a RAS signal arrives, latches an address by an address latch signal to output an address complementary signal by a signal output from the row-address circuit 17.

That is to say, when the external address signal changes from LOW to HIGH, an internal address inversion signal proceeds from LOW to LOW and an internal address signal changes from LOW to HIGH, accordingly.

When the external address signal is in a state of from LOW to LOW, an internal address inversion signal is in a state of from LOW to LOW and an internal address signal is in a state of from LOW to LOW.

This address-complementary signal is composed of 8 bits in this circuit and 2 bits are output to ¼ word driver decoder and 6 bits are output to a row pre-decoder.

FIG. 4 is a block diagram showing the construction, in a chip layout image, of an embodiment in accordance with the present invention.

In FIGS. 5A and 5B, reference numeral 30 denotes a RAS-first stage circuit and 31 denotes a charge-up transistor for a charging means.

The charge-up transistor 31 is an N-channel MOS transistor which charges up the word-line drive signal and its input uses a reset signal of the decoder.

FIG. 6 is a circuit diagram showing the construction of a major part of an embodiment.

In FIG. 6, $C_1$ and $C_2$ are load capacitors of a word-line drive signal and a word-line drive signal after decoding. $R_1$ and $R_2$ are wiring resistances, accordingly.

Conventionally, when the load of $C_1$ and $C_2$ is large, it takes too much time to charge up and boosting of the word-line potential at high speed and with high efficiency has been impossible.

In an embodiment of the present invention, a wiring path of the word-line drive signal is charged up by a reset signal of a decoder to increase the vote of rise of the word-line drive signal to a level ($V_{cc}-V_{th}$) which can fully demonstrate the boost effect. Immediately thereafter, the word-line-drive signal is boosted by the word-line-boost-generation circuit 10 to make the potential of word-lines rise at high speed and with high efficiency.

When a plurality of word-lines are driven in a word-line boost generation circuit 10, the provision of a plurality of charge-up transistors offers a more conspicuous effect thereto.

In general, the intrinsic capacitance corresponds to a gate capacitance of a transistor, which includes a gate-source capacitance and a gate-drain capacitance. The parasitic capacitance includes a pn junction capacitance which produces at the source and drain of a transistor, and a so-called wiring capacitance which the wiring forms with a substrate. As for a MOS field effect transistor, the wiring capacity $C_L$ is represented by the expression, $$C_L \text{ (1PF)} = \frac{0.354 \times L \times W}{t_{ox}}$$

where L is wiring length (μm), W a width of the wiring (μm) and $t_{ox}$ a thickness of a film (μm).

The above capacitances are summed up as a C. When the capacitance value increases, that is, when the wiring length is long and the transistor becomes large, the charging time of charge is long.

Furthermore, when the wiring is long, resistance is serious problem. For example, in the case of aluminum wiring, suppose that a wiring width W=1 μm, a wiring length l=10 μm, and a sheet resistance $\rho^s$=50 mΩ/□ (at a thickness of 8000A). The wiring resistance becomes 500Ω at that time. If the then wiring capacitance is 1 PF, a time constant becomes 0.5 ns, so it obstructs the transmission of a high speed signal. Since a wiring of polysilicon is higher by three orders in a sheet resistance, this problem should be regarded as of major importance.

Generally, the resistance is given by the following expression.

$$R = \frac{L}{W} \times \rho_s$$

where R is a wiring resistance (Ω), L a wiring length (μm), W a wiring width (μm), and $\rho_s$ a sheet resistance value (Ω/μm²).

Figure 7:
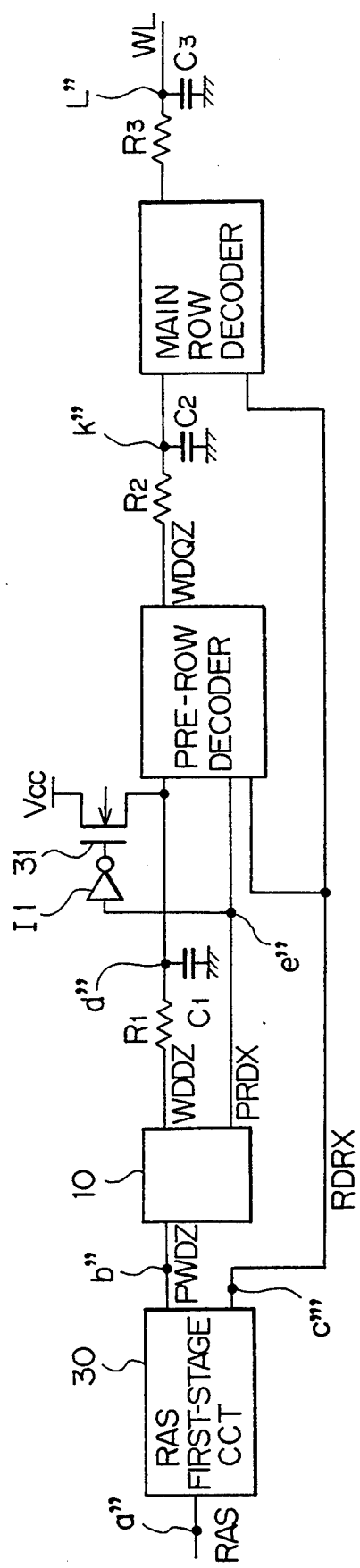
FIG. 7 is a block diagram showing the circuit construction of a major part of another embodiment of the semiconductor storage device.

FIG. 7 is a block diagram showing the circuit construction of a major part of another embodiment of the semiconductor storage device.

In the above-described embodiment (in FIG. 6), a reset signal from the decoder is utilized in order to control a charge-up transistor, whereas in the present embodiment, a signal applied corresponding to a reset signal from the decoder or, to put it concretely, a word-line line reset signal (PRDX) is used.

Nevertheless, since the word-line reset signal (PRDX) becomes LOW in an active time, an inverter $I_1$ is additionally provided in order to operate in the same way as in the above-mentioned embodiment. That is to say, the inverter $I_1$ is connected with a charge-up transistor 31 and a connecting line between the word-line voltage booster circuit 10 and a pre-row decoder 2.

Figure 8:
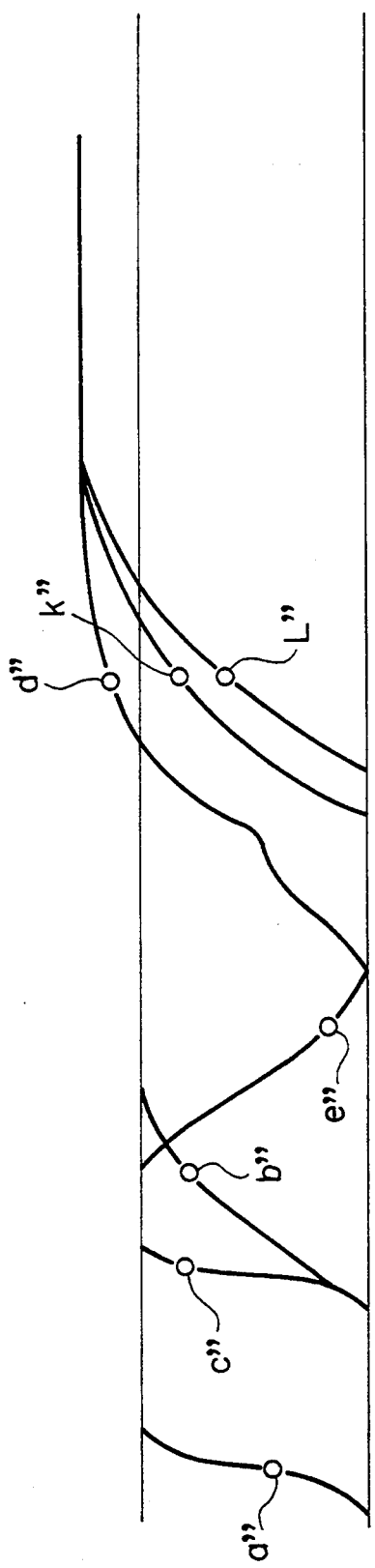
FIG. 8 is a view showing the potential level in each node in FIG. 7.

FIG. 8 shows the potentials of each node, a", b", c", d", e", k" and, in FIG. 7.

Figure 9:
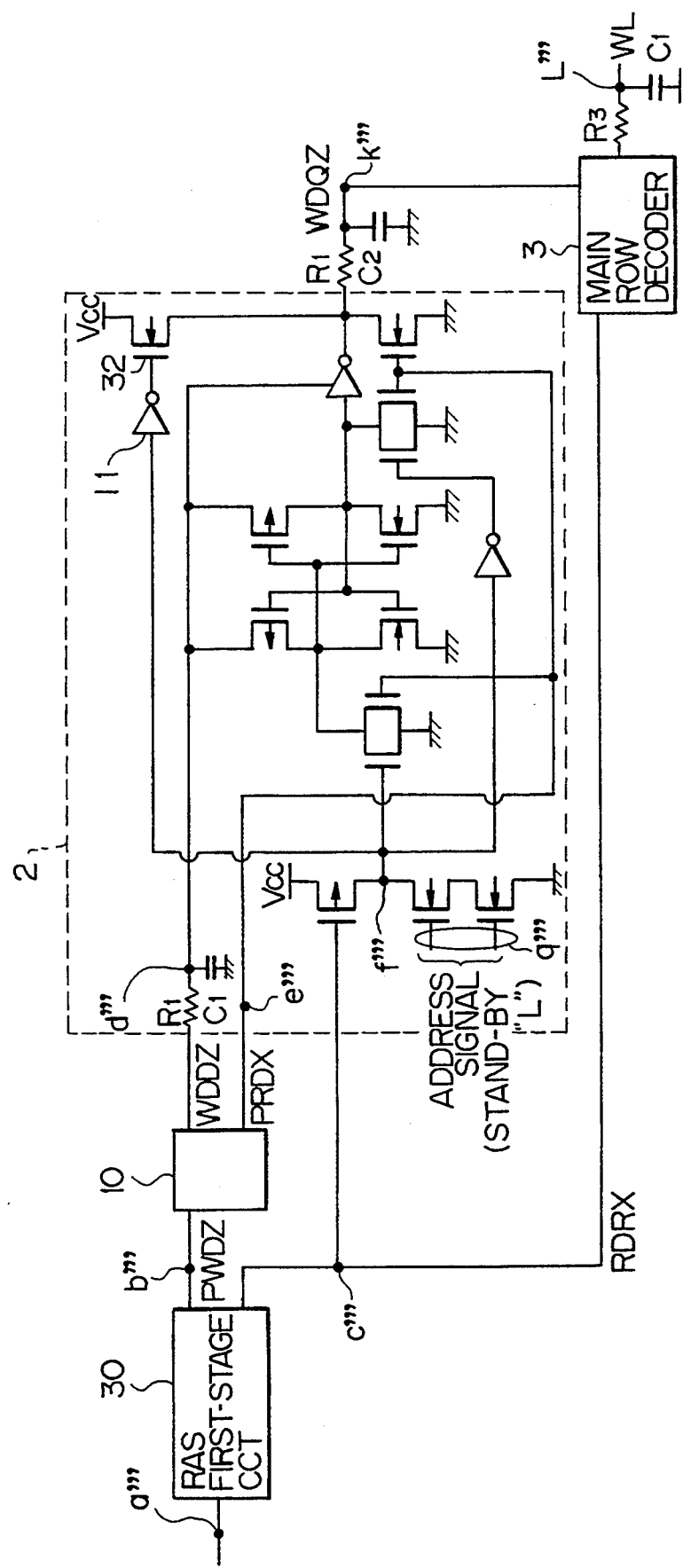
FIG. 9 is a circuit diagram showing the construction of a major part of still another embodiment.

FIG. 9 is a circuit block diagram showing still another embodiment of the semiconductor storage device in accordance with the present invention.

In the embodiments of FIG. 6 and FIG. 7, since there is the possibility that a multiple selection may occur from a pre-row decoder 2 if the row address signal is not decided, it is necessary to control the charge-up transistor 31 after the row address signal has been established.

Figure 10:
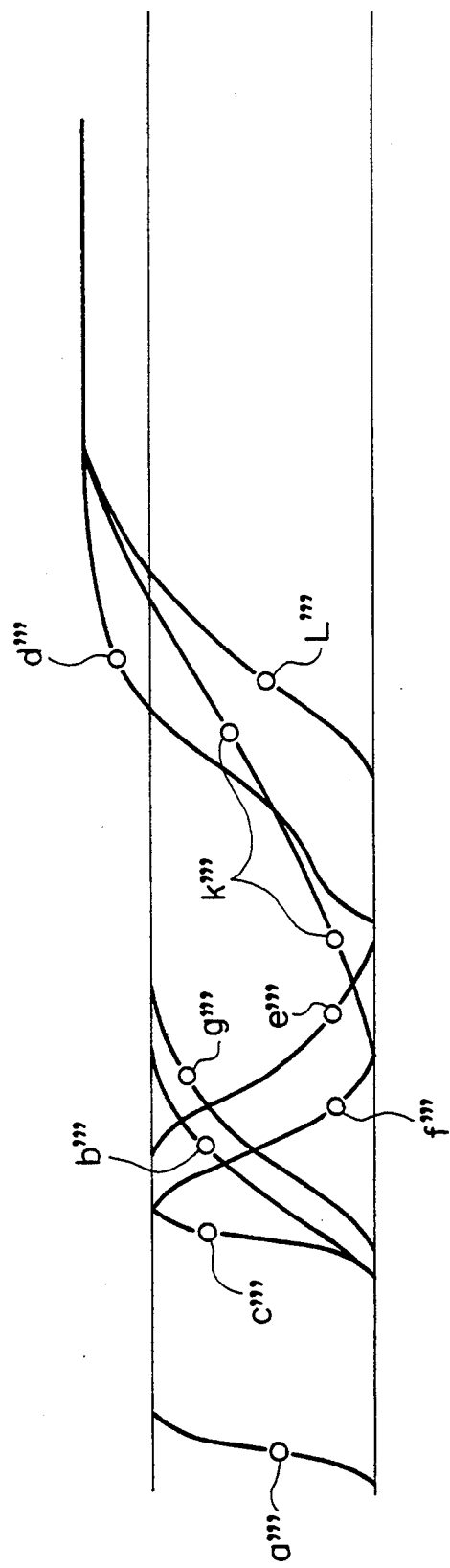
FIG. 10 is a view showing the potential level in each node in FIG. 9.

Therefore, in the present embodiment of FIG. 10, an address signal is used for a control of the charge-up transistor 31.

A pre-charge transistor 32 turns ON an address input of the pre-row decoder 2 and a charge-up operation started by the decoded word-line drive signal, boosts the potential quickly. Immediately thereafter, the word-line voltage booster circuit 10 is driven to thereby give the word-line drive signal a boosted potential level. Then, since the word-line drive signal, after decoding, has started to charge via the charge-up transistor 32, a desired boosted potential level can be attained in a short time.

FIG. 10 is a view showing the potential level in each node in FIG. 9.

In the present embodiment of FIG. 9, the charge-up transistor 32 is designed to charge up the word-line drive signal (WDQZ) after decoding, but if the word-line drive signal (WDDZ), before decoding is also charged up, the vote of rise of the word-line potential can be increased.

We claim:

1. A semiconductor storage device having a word-line booster circuit comprising:
   a plurality of word-lines connected to each memory cell array;
   a drive signal generation means, operably coupled to said plurality of word-lines, for producing a word-line drive signal having a voltage higher than a power supply voltage;
   a decoder means, operably coupled to said drive signal generation means, for transmitting said word-line drive signal produced by said drive signal generation means, when said drive signal generation means is selected by an address signal; and
   a charging means, operably coupled to said drive signal generation means and to said decoder means, and connected to a signal path which transmits said word-line drive signal from said drive signal generation means to said decoder means, wherein said charging means charges said signal path before said word-line drive signal is output to said signal path.

2. A semiconductor storage device according to claim 1, wherein said charging means is selectively activated based on a reset signal which resets said decoder means.

3. A semiconductor storage device according to claim 1, wherein said charging means is activated after said address signal has been established.

4. A semiconductor storage device comprising:
   a plurality of word-lines connected to each memory cell array;
   a drive signal generation means, operably coupled to said plurality of word-lines, for generating a word-line drive signal which has a voltage value higher than the power supply voltage;
   a pre-decoder means, operably coupled to said drive signal generation means, for receiving a first address signal and said word-line drive signal;
   a main decoder means, operably coupled to said pre-decoder means, for receiving an output of said pre-decoder means and a second address signal; and
   a charging means, operably coupled to said drive signal generation means and to said pre-decoder and main decoder means, and further connected to at least one signal path between a first signal path from said drive signal generation means to said pre-decoder means or a second signal path from said pre-decoder means to said main decoder means, wherein said charging means charges either said first signal path or said second signal path before said word-line drive signal is output to said signal path.

* * * * *